(12) United States Patent
Accard et al.

(10) Patent No.: US 9,160,139 B2
(45) Date of Patent: Oct. 13, 2015

(54) LASER EMISSION DEVICE WITH INTEGRATED LIGHT MODULATOR

(71) Applicant: Commissariat à l'Engerie Atomique et aux Energies Alternatives, Paris (FR)

(72) Inventors: Alain Accard, Marcoussis (FR); Franck Mallecot, Palaiseau (FR); Fabrice Blache, Palaiseau (FR)

(73) Assignee: Commissariat A L'Energie Atomique Et Aux Energies Alternatives (FR)

( * ) Notice: Subject to any disclaimer, the term of this patent is extended or adjusted under 35 U.S.C. 154(b) by 0 days.

(21) Appl. No.: 14/310,737

(22) Filed: Jun. 20, 2014

(65) Prior Publication Data

US 2014/0376578 A1    Dec. 25, 2014

(30) Foreign Application Priority Data

Jun. 21, 2013  (EP) .................................... 13305845

(51) Int. Cl.

| | |
|---|---|
| *H01S 3/10* | (2006.01) |
| *H01S 5/026* | (2006.01) |
| *H01S 5/02* | (2006.01) |
| *H01S 5/22* | (2006.01) |
| *H01S 5/0625* | (2006.01) |
| *H01S 5/10* | (2006.01) |

(52) U.S. Cl.
CPC ............... *H01S 5/0265* (2013.01); *H01S 5/021* (2013.01); *H01S 5/026* (2013.01); *H01S 5/0218* (2013.01);
(Continued)

(58) Field of Classification Search
CPC ............ H01S 3/0085; H01S 3/08004; H01S 3/08009; H01S 3/10; H01S 5/0014; H01S 5/0265; H01S 5/0657; H01S 5/101; H01S 5/141; H01S 5/143; H01S 5/22; H01S 5/3063; H01S 5/3216

USPC ............................................................ 372/28
See application file for complete search history.

(56) References Cited

U.S. PATENT DOCUMENTS

| | | | | |
|---|---|---|---|---|
| 6,246,500 | B1 * | 6/2001 | Ackerman ................... | 398/115 |
| 2003/0112842 | A1 * | 6/2003 | Crawford ....................... | 372/46 |
| 2009/0245298 | A1 * | 10/2009 | Sysak et al. ..................... | 372/22 |

FOREIGN PATENT DOCUMENTS

| | | |
|---|---|---|
| EP | 2544319 A1 | 1/2013 |
| WO | 02058251 A2 | 7/2002 |

OTHER PUBLICATIONS

Siddharth R. Jain, et al., "Integrated Hybrid Silicon DFB Laser-EAM Array Using Quantum Well Intermixing", Optics Express, vol. 19, No. 14, Jul. 5, 2011, p. 13692.

(Continued)

*Primary Examiner* — Tod T Van Roy
*Assistant Examiner* — Vu A Vu
(74) *Attorney, Agent, or Firm* — Blank Rome LLP

(57) ABSTRACT

Laser emission device with integrated light modulator comprising: a multilayer waveguide comprising, on a support layer, a first guiding layer, a first doped layer, a second guiding layer of light amplifying material, and a biasing second doped layer opposite the first doped layer, the waveguide comprising a laser amplification section (50), a light modulation section (52) comprising an extraction zone for radiating the light, a transition section (51) inserted between the laser amplification section and the light modulation section, a positive first electrode for injecting a pumping current into the laser amplification section, a positive second electrode for injecting a modulation signal into the modulation section, a negative third electrode, and a reference fourth electrode, the second doped layer comprising an electrical insulation situated in the transition section to form a resistive channel.

11 Claims, 3 Drawing Sheets

(52) U.S. Cl.
CPC .......... *H01S 5/1032* (2013.01); *H01S 5/06251* (2013.01); *H01S 5/1014* (2013.01); *H01S 5/22* (2013.01)

(56) References Cited

OTHER PUBLICATIONS

Jain S.R. et al., "Integrated Hybrid Silicon Transmitters", Journal of Lightwave Technology, IEEE Service Center, New York, NY, vol. 30, No. 5, Mar. 1, 2012, pp. 671-678.

Hyundai, Park et al., "Device and Integration Technolofy for Silicon Photonic Transmitters", IEEE Journal of Selected Topics in Quantum Electronics, IEEE Service Center, Piscataway, NJ, vol. 17, No. 3, May 1, 2011, pp. 671-688.

Dekun Liu et al., "Rate Equation Analysis of High Speed Q-Modulated Semiconductor Laser", Journal of Lighwave Technology, IEE Service Center, New York, NY, vol. 28, No. 21., Nov. 1, 2010.

\* cited by examiner

LASER EMISSION DEVICE WITH INTEGRATED LIGHT MODULATOR

REFERENCE TO RELATED APPLICATION

The present application claims benefit to European Patent Application No. 13305845.3, filed Jun. 21, 2013, whose disclosure is hereby incorporated by reference in its entirety into the present disclosure.

TECHNICAL FIELD

The invention relates to the field of modulable semiconductor laser emission devices, notably to a laser source that can be used in optical communications and in particular in an optical network with wavelength division multiplexing (WDM).

TECHNOLOGICAL BACKGROUND

An electro-absorption modulator coupled to a laser source exists with the use of a biasing tee making it possible to associate a DC component with the radio frequency signal. The biasing tee has a significant bulk which is prohibitive for the production of a compact component. Furthermore, this solution necessitates the use of a matching resistor with a value of 50 ohms at the terminals of the electro-absorption modulator. This resistor produces a heat dissipation of 300 mW.

SUMMARY OF THE INVENTION

One idea on which the invention is based is to provide a laser device including an electro-absorption modulator of small bulk. Another idea on which the invention is based is to provide said device with reduced heat dissipation.

According to one embodiment, the invention provides a laser emission device with integrated light modulator comprising:
a multilayer waveguide, the waveguide extending along a longitudinal direction of the device,
the waveguide comprising, on a support layer made of silicon dioxide,
a first guiding layer of silicon,
a first doped layer,
a second guiding layer of light amplifying material, and
a biasing second doped layer opposite the first doped layer,
  the waveguide comprising, along the longitudinal direction
a laser amplification section,
a light modulation section comprising an extraction zone for radiating the light of a resonant optical mode towards the exterior of the device, and a transition section inserted in the longitudinal direction, between the laser amplification section and the light modulation section,
the device also comprising:
a positive first electrode coupled to the laser amplification section to inject a pumping current into the laser amplification section,
a positive second electrode coupled to the light modulation section to inject a modulation signal into the modulation section,
a negative third electrode coupled to the first doped layer in the modulation section to apply a biasing electrical potential to the first doped layer, and a reference fourth electrode coupled to the first doped layer in the laser amplification section,
in which the second doped layer comprises an electrical insulation situated in the transition section of the waveguide to form a resistive channel.

According to embodiments, said laser emission device with integrated light modulation can comprise one or more of the following features.

According to an embodiment, the electrical insulation is obtained by a protonated insertion zone of the second doped layer.

By virtue of these features, the device remains compact.

According to an embodiment, the resistive channel exhibits a resistance of between 1 and 10 k$\Omega$, which makes it possible to independently set the bias of the laser and the bias of the modulator.

By virtue of these features, the dissipated power is limited, to a negligible level.

According to an embodiment, the second doped layer and the positive first electrode form a narrow ridge positioned on the second guiding layer, the narrow ridge having a width approximately 5 times less than that of the second guiding layer in a part of the amplification section.

According to an embodiment, the width of the second guiding layer in a part of the amplification section and a part of the modulation section, called full width zones, is approximately 5 times greater than the width, called narrow zone, of said second guiding layer in the transition section.

According to an embodiment, the width of the second guiding layer is progressively reduced from the width of each full width zone to the width of the narrow zone.

By virtue of these features, the optical propagation of the mode between the amplification section and the modulation section is not disturbed.

According to an embodiment, a width wise profile of the first guiding layer is identical to a width wise profile of the second guiding layer.

By virtue of these features, the optical propagation of the mode in the waveguide is not disturbed.

According to an embodiment, the first guiding layer, the first doped layer, the second guiding layer, the second doped layer and the positive first electrode form a narrow ridge in the transition section.

By virtue of these features, the transition section forms a resistive channel of small bulk.

According to an embodiment, the resistive channel has a width less than 3 µm.

According to an embodiment, the transition zone has a length substantially equal to 50 µm.

According to an embodiment, the second doped layer and the third doped layer are selected from materials from the group III-V of semiconductors.

By virtue of these features, the device can be in a configuration bonded onto silicon on insulator.

According to an embodiment, the second doped layer has a thickness less than 250 nm.

By virtue of these features, the production of a structure composed of materials from the group III-V bonded onto silicon on insulator is possible without disturbing the optical mode.

According to an embodiment, the positive first electrode and the second doped layer are separated by a layer of a positively doped gallium indium arsenide alloy.

According to an embodiment, the positive second electrode and the second passive layer of said modulation section are separated by a layer of a positively doped gallium indium arsenide alloy.

According to an embodiment, the negative third electrode is connected to a negative DC potential, the positive first electrode is connected to a positive DC potential, the reference electrode is connected to an earth electrical potential and the positive second electrode is connected to a base band signal generator.

BRIEF DESCRIPTION OF THE FIGURES

The invention will be better understood, and other aims, details, features and advantages thereof will become more clearly apparent from the following description of a particular embodiment of the invention, given purely as an illustrative and non-limiting example, with reference to the attached drawings.

DETAILED DESCRIPTION OF EMBODIMENTS

Figure 1:
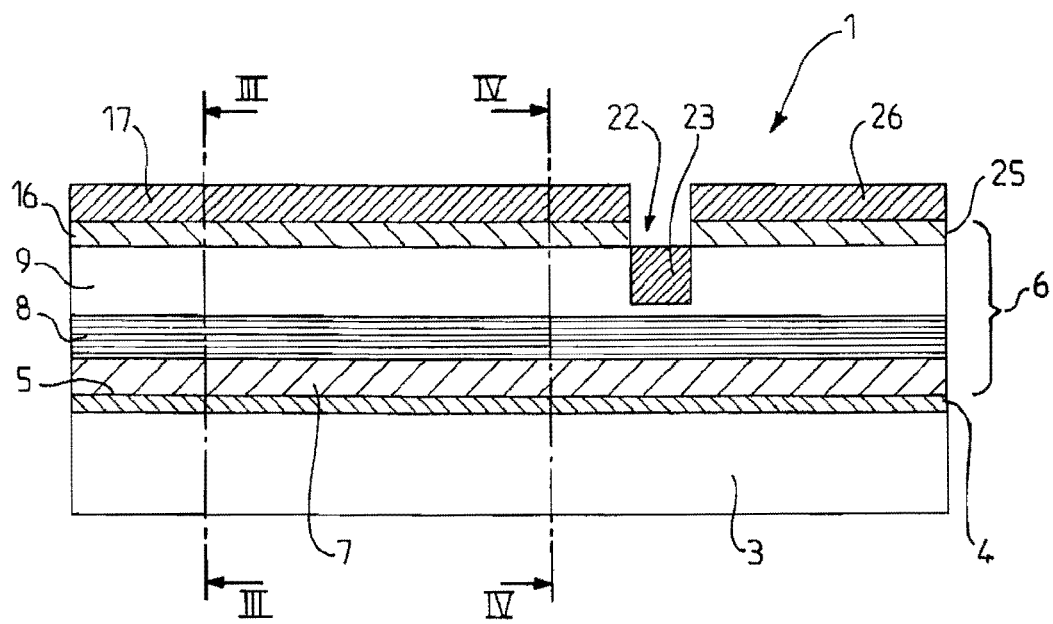
FIG. 1 is a longitudinal cross section of the slice of a laser device.
Figure 2:
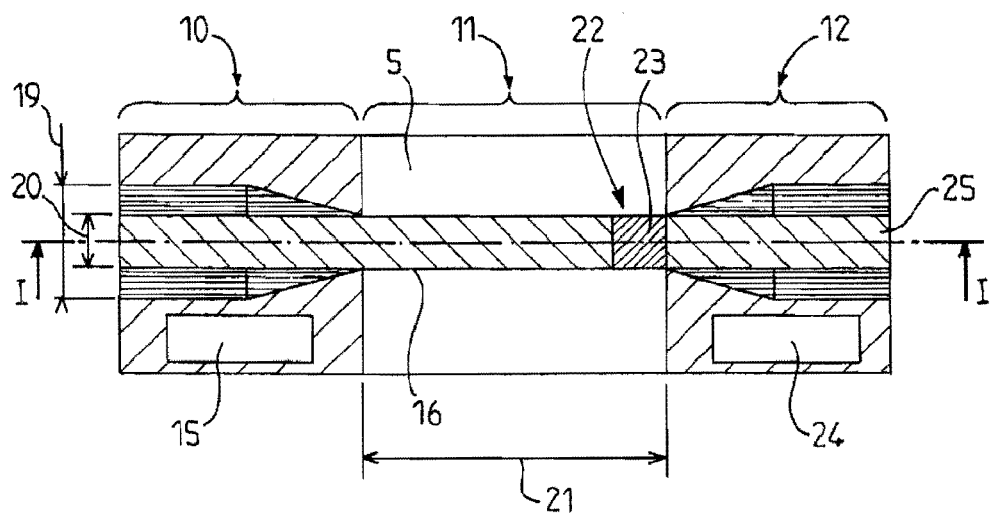
FIG. 2 is a plan view of the device of FIG. 1.

With reference to FIGS. 1 to 4, there now follows a description of a semiconductor laser source 1 represented from different views, notably cross-sectional views. FIGS. 1 and 2 represent the device, with a longitudinal enlargement over the transition section. By convention, vertical direction is used to denote the direction at right angles to the stratification of the layers following one another in the slice of a cross-sectional view or a section of the component.

Starting from the bottom of the figures, in the vertical direction, the laser source comprises a first semiconductor optical component 2, produced as silicon on insulator (SOI). This first optical component consists of a base layer 3 of silicon dioxide SiO2, and a guiding layer 4, of silicon. The interfaces between layers are planar and parallel. The guiding layer 4 is covered with a thin layer of silicon dioxide, not represented.

On the top surface 5 of the component 2, there is arranged, by bonding, a semiconductor multilayer structure 6, produced for example in materials from the group III-V. This multilayer structure comprises a negatively-doped first layer 7, an active layer 8, two positively-doped layers 9 and 16. The doped layers 7 and 9 are doped differently, with an opposite bias to allow the application of an electrical potential between the two layers. The assembly that is thus obtained forms a P-N junction. Thus, the doped layer 7 is negatively doped, whereas the doped layer 8 is positively doped.

The duly assembled assembly of layers constitutes a waveguide forming a ridge orientated along a longitudinal axis, which corresponds to the axis I-I of the cross section of FIG. 1, represented in FIG. 2.

Along the longitudinal axis, the device comprises an amplification section 10 followed by a transition section 11, then a modulation section 12.

The waveguide in the amplification section 10 contains an amplification means corresponding to the active layer 8. This amplification means is obtained using a quantum-well material. This section produces a stimulated light emission which is propagated through the transition section 11, to the modulation section 12. The amplification section 10 is powered using two electrodes, making it possible to apply an electrical signal to the P-N junction. A positive first electrode 17 is produced using a metallization on a part of the doped layer 9.

This positive electrode 17 begins in the amplification section 10 and extends into a part of the transition section 11. This positive electrode 17 leaves a non-metallized portion 22 of the doped layer 9. A reference electrode 15 is also produced by metallization, on a portion of the doped layer 7. To improve the biasing, a strongly positively-doped layer 16 is sandwiched between the positively doped layer 9 and the electrode 17.

Figure 3:
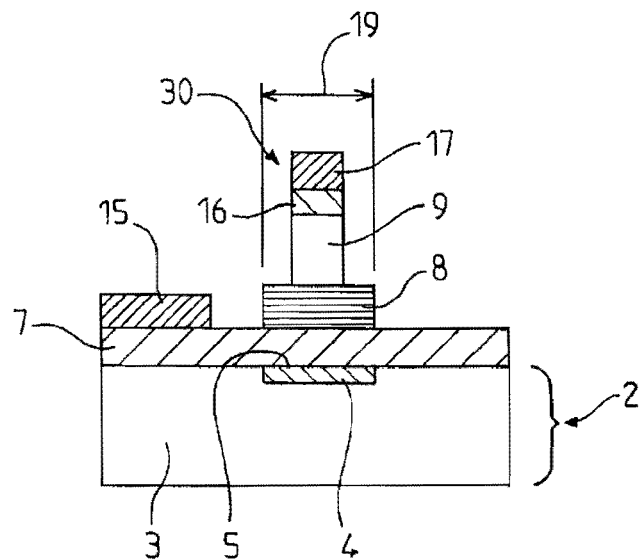
FIG. 3 is a cross-sectional view of the device of FIG. 1, along the cutting line III-III.

FIGS. 2 and 3 show also that the width of different layers of material III-V forming the ridge varies, in the amplification section. The width 19 of the active layer 8 is, for example, five times greater than the width 20 of the top layers, the doped layers 9 and 16 and the positive electrode 17. This ridge profile 30 is known as "shallow-ridge" structure. In the interface zone between the amplification section 10 and the transition section 11, the width of the active layer 8 decreases in a bevel to form an active layer of the width 20 of the top layers in the transition section 11.

Figure 4:
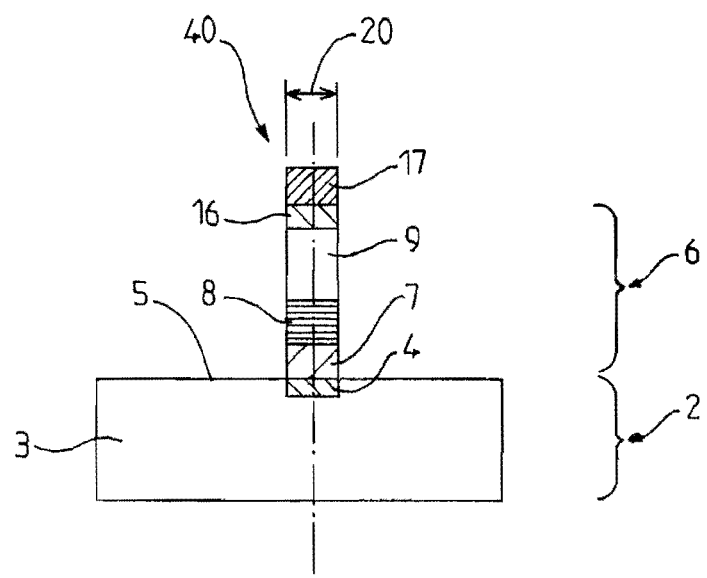
FIG. 4 is the view of a section of the device of FIG. 1 along the section IV-IV.

In the transition section, as FIG. 4 shows, the waveguide forms a deep ridge 40, known as deep-ridge structure; this deep ridge 40 is narrow. It comprises, at one end, at the interface with the modulation section, the non-metallized portion 22. In this non-metallized portion 22, the doped layer 9 is insulated in the depth 23. This insulation 23 consists of a proton-charged zone. This charge is obtained by a high-energy hydrogen bombardment which penetrates the doped layer 9.

The length 21 of the transition section is relatively great relative to the width 20 of the ridge 40. The resistance of a duly constructed N channel is the product of the resistance squared of this layer, multiplied by the length 21 of the channel, divided by its width 20.

At the second end of the transition section, at the interface of the insulated zone 23 and of the modulation section 12, the active layer 8 covers a width similar to its width 19 in the amplification section 10. The ridge thus formed in the modulation section 12 is called "shallow-ridge" structure, just like for the amplification section 10.

The modulator also comprises two electrodes. These electrodes allow for the biasing and therefore the control of the modulator. They are used to apply an electrical field in a direction at right angles to the modulated light beam. A negative electrode 24 is coupled to the doped layer 7, to apply a biasing electrical potential to the doped layer 7. For example, a DC power supply of −4V is applied to this negative electrode 24. A positive electrode 26 is coupled via a strongly positively-doped layer 25, to the part of the doped layer 9 situated in the modulation section 12. The positive electrode 26 makes it possible to inject a modulation signal.

Throughout the device, the width profile of the guiding layer 4 is identical to that of the active layer 8. Furthermore, the change of structure between the three sections of the optical component and therefore the transition from a shallow-ridge structure to a deep-ridge structure and then again to a shallow-ridge structure does not disturb the optical propagation of the mode in the component.

Such a component can for example be obtained using a doped layer 7 made of indium phosphide (InP). The active layer 8 is obtained using a quantum-well material, for example a structure consisting of 6 InGaAsP wells and barriers emitting at a wavelength of 1.55 µm. The doped layer 9 is for example made of indium phosphide (InP). The layers 16 and 25 are produced using a gallium indium arsenide alloy (InGaAs). The electrodes 15, 17, 24 and 26 are produced in a material with low electrical resistance. The material used can also have a high resistance to oxidation. For example, the electrodes are produced with gold (Au).

Figure 5:
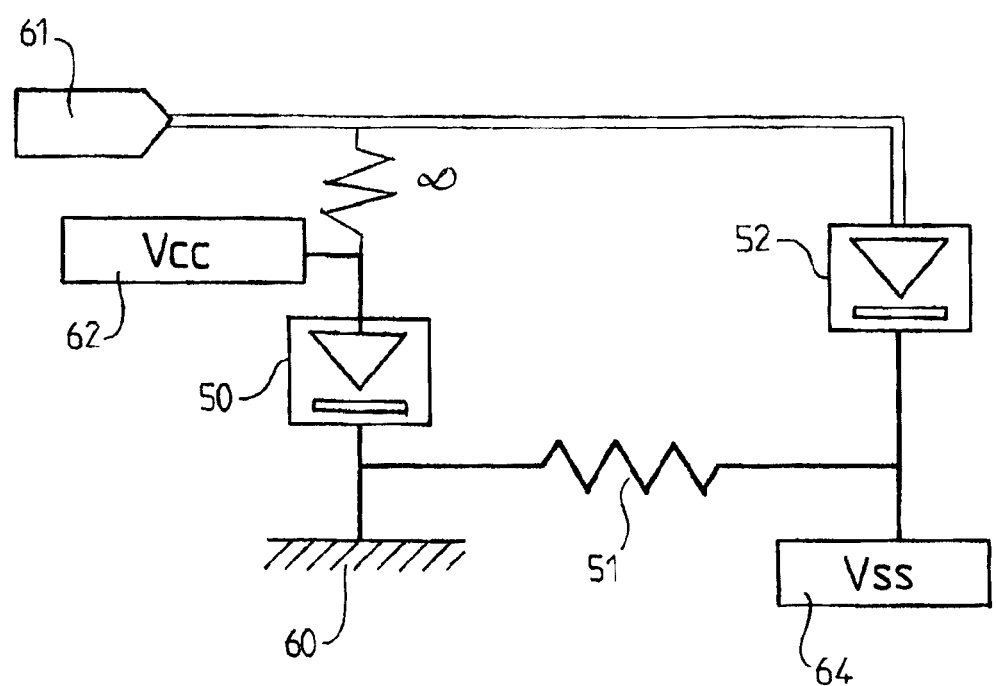
FIG. 5 is a functional schematic representation of the device of FIG. 1.

With reference to FIG. 5, the biasing principle of the laser emission device with integrated light modulator is schematically represented. In this system, laser amplification section 50 behaves like a diode whose negative electrode is linked to the earth 60, and the positive electrode is linked to a DC voltage 62. The DC voltage 62 applied is, for example +2 volts. The transition section 51 separates the amplification section 50 from the modulation section 52. This modulation section 52 is linked by its negative electrode to a biasing electrical potential 64. This biasing electrical potential 64 is, for example −4 volts. A modulation signal 61 is applied to the positive electrode of the modulation section 52 to control the emission of the laser device.

The structure of the laser emission device described in FIGS. 1 to 5 makes it possible to create a resistive channel of at least one 1 kΩ in the transition section 51, 11, between the negatively doped layer 7 of the amplification section and the negatively doped layer 7 of the modulation section.

For example, for a doped layer 7, with a doping of $7\ 10^{17}$ cm-3, of which the thickness is 200 nm, the width 20 is 2 μm, the length 21 is 50 μm for a laser device with a length of at least 300 μm, the resistance per square is 100 ohm. The inter-electrode resistance in the transition section reaches 2.5 Ωk.

Although the invention has been described in conjunction with a particular embodiment, it is obvious that it is in no way limited thereto and that it comprises all the technical equivalents of the means described as well as their combinations provided that they fall within the framework of the invention.

In operation, the electrode 26 is powered by a base band signal generator, not represented, which can be produced in different forms, in a unitary or distributed manner, by means of hardware and/or software components. Hardware components that can be used are custom integrated circuits ASICs, programmable logic arrays FPGAs or microprocessors. Software components can be written in different programming languages, for example C. C++, Java or VHDL. This list is not exhaustive.

"Comprise" or "include" and its conjugated forms does not preclude the presence of elements or steps other than those described in a claim. The use of the indefinite article "a" or "an" for an element or a step does not preclude, unless stated otherwise, the presence of a plurality of such elements or steps.

In the claims, any reference symbol between parentheses should not be interpreted as a limitation of the claim.

The invention claimed is:

1. Laser emission device with integrated light modulator comprising:
   a multilayer waveguide, the waveguide extending along a longitudinal direction of the device, the waveguide comprising, on a support layer made of silicon dioxide,
      a first guiding layer of silicon,
      a first doped layer,
      a second guiding layer of light amplifying material, and
      a biasing second doped layer opposite the first doped layer,
   the waveguide comprising, along the longitudinal direction
      a laser amplification section,
      a light modulation section comprising an extraction zone for radiating the light of a resonant optical mode towards the exterior of the device, and
      a transition section inserted in the longitudinal direction, between the laser amplification section and the light modulation section,
   the device also comprising:
      a positive first electrode coupled to the laser amplification section, and
      a positive DC potential connected to the positive first electrode to inject a pumping current into the laser amplification section,
   wherein the device also comprises:
      a positive second electrode coupled to the light modulation section,
      a base band signal generator connected to the positive second electrode to inject a modulation signal into the modulation section,
      a negative third electrode coupled to the first doped layer in the modulation section to apply a biasing electrical potential to the first doped layer, the modulation signal being applied between the positive second electrode and the negative third electrode to control the emission of the laser device,
      a reference fourth electrode coupled to the first doped layer in the laser amplification section,
      an earth electrical potential linked to the reference fourth electrode, the pumping current being injected by applying a DC voltage between the fourth reference electrode and the positive first electrode,
   wherein the first guiding layer, the first doped layer, the second guiding layer, the second doped layer and the positive first electrode form a narrow ridge in the transition section, the narrow ridge being narrower than the first doped layer in the laser amplification section and the light modulation section, such that the first doped layer forms a first resistive channel of small bulk between the third electrode and the fourth electrode in the transition section,
   wherein the second doped layer comprises an electrical insulation situated in the transition section of the waveguide to form a second resistive channel between the first electrode and the second electrode in the second doped layer, in which the electrical insulation is obtained by a protonated insertion zone of the second doped layer, and
   the first resistive channel exhibits a resistance of between 1 and 10 kΩ, which makes it possible to independently apply the DC voltage to the laser amplification section and the modulation signal to the light modulation section.

2. Device according to claim 1, wherein the second doped layer and the positive first electrode in the narrow ridge have a width approximately 5 times less than that of the second guiding layer in a part of the amplification section.

3. Device according to claim 1, wherein the width of the second guiding layer in a part of the amplification section and a part of the modulation section, called full width zones, is approximately 5 times greater than the width, called narrow zone, of said second guiding layer in the transition section.

4. Device according to claim 1, wherein the width of the second guiding layer is progressively reduced from the width of each full width zone to the width of the narrow zone.

5. Device according to claim 1, wherein a width wise profile of the first guiding layer is identical to a width wise profile of the second guiding layer.

6. Device according to claim 1, wherein the narrow ridge has a width less than 3 μm.

7. Device according to claim 1, wherein the transition zone has a length substantially equal to 50 μm.

8. Device according to claim 1, wherein the second doped layer and the third doped layer are selected from materials from the group III-V of semiconductors.

9. Device according to claim 1, wherein the second doped layer has a thickness less than 250 nm.

10. Device according to claim 1, wherein the positive first electrode and the second doped layer of said amplification section are separated by a layer of a positively doped gallium indium arsenide alloy.

11. Device according to claim 1, wherein the positive second electrode and the second doped layer of said modulation section are separated by a layer of a positively doped gallium indium arsenide alloy.

* * * * *